United States Patent [19]
Watson

[11] 3,959,671
[45] May 25, 1976

[54] HIGH CURRENT PULSER CIRCUIT

[75] Inventor: William Stanley Watson, Colonial Beach, Va.

[73] Assignee: The United States of America as represented by the Secretary of the Navy, Washington, D.C.

[22] Filed: June 20, 1975

[21] Appl. No.: 588,998

[52] U.S. Cl.............................. 307/270; 307/260; 307/264; 307/268
[51] Int. Cl.² .................... H03K 1/00; H03K 3/26
[58] Field of Search .......... 307/270, 260, 264, 268, 307/254

[56] References Cited
UNITED STATES PATENTS

| | | | |
|---|---|---|---|
| 3,126,490 | 3/1964 | Stern | 307/270 |
| 3,508,224 | 4/1970 | Putterman | 307/270 |
| 3,624,620 | 11/1971 | Andrews | 307/270 |
| 3,662,191 | 5/1972 | Aley | 307/270 |
| 3,824,408 | 7/1974 | Brunel | 307/270 |
| 3,914,628 | 10/1975 | Pao et al. | 307/270 |

OTHER PUBLICATIONS

"Speed-Up of TTL Circuits," by Gersbach, IBM Tech. Disc. Bulletin, Vol. 14, No. 6, Nov. 1971, p. 1685.

"TTL Circuit for Driving Heavy Load," by Wiedman, IBM Tech. Disc. Bulletin, Vol. 14, No. 5, Oct. 1971, p. 1436.

Primary Examiner—Stanley D. Miller, Jr.

[57] ABSTRACT

The circuit shapes and amplifies a logic pulse to drive loads which require high current levels such as light emitting diodes or semiconductor lasers. Automatic load protection and high speeds are provided by an inductor shunt within the circuit. The simplicity and lack of capacitors in the circuit make it ideal for gun fired applications such as optical telemetry.

4 Claims, 1 Drawing Figure

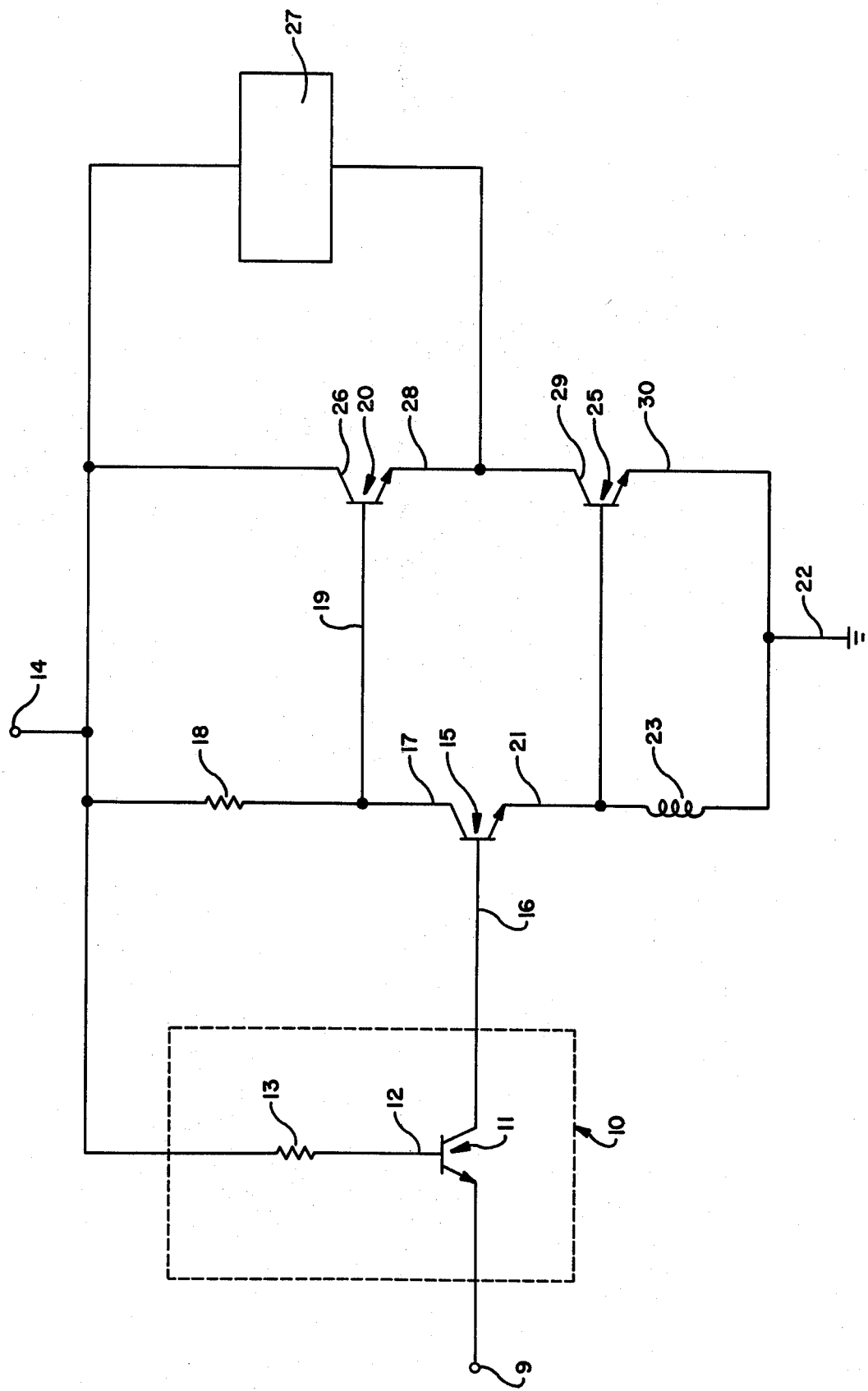

3,959,671

HIGH CURRENT PULSER CIRCUIT

BACKGROUND

Often a DC amplifier has been used to form high power pulses from a previously shaped pulse. This offers no power limit to the load and requires a great deal of circuitry to maintain a large bandwidth.

Capacitive coupling to the load has also been used to generate high power pulses, but capacitors suffer from high accelerations and the pulses are exponential in decay rather than square.

SUMMARY

The invention is a high current pulser circuit providing a constant pulse amplitude and width at various duty cycles without capacitors in the circuit. The circuit is stable under extreme shock and acceleration, such as found when a projectile is fired from a gun. The invention also automatically limits the power output to protect the load.

The invention can be used to drive light emitting diodes in an optical pulse position modulation telemetry scheme. It can also be used to power a solid state laser diode. For example, it is placed within a dummy fuze of a projectile and the light pulses are timed to give data phenomena happenings within the projectile before the projectile leaves the barrel.

With an input connected to a first transistor, a second transistor turns on. Current then flows through the base of a third transistor which turns on and causes a high current to flow through the load. When the inductor saturates and shunts the base, the third transistor turns off, terminating the current through the load. During this time, the second transistor, being on, pulls current through a resistor. When the input through the first transistor stops, the second transistor turns off. The resistor now pulls current through a fourth transistor which shunts off any capacitively retained load voltage.

STATEMENT OF OBJECTS OF INVENTION

An object of this invention is to provide a high current pulser circuit capable of withstanding shocks and accelerations greater than 20,000 g's.

Another object of this invention is to provide a high current pulser circuit with constant amplitude and width pulses of electrical energy at various duty cycles.

An object of this invention is to provide a high current pulser circuit which will automatically limit the power output to protect the load.

Other objects, advantages and novel features of the invention will become apparent from the following detailed description of the invention when considered in conjunction with the accompanying drawing.

BRIEF DESCRIPTION OF THE DRAWING

The single FIGURE of the drawing is a circuit diagram of the high current pulser circuit.

DETAILED DESCRIPTION OF THE INVENTION

The high current pulser circuit is shown in the drawing. In the description of the drawing specific values are given for all resistors and each transistor is identified. This is done to better enable one to understand the invention and these specific identifications are not to be construde as limitations on the invention. The logic input 9 is connected to the input stage 10. The input stage 10 may be modified to operate at various logic levels and signals. As shown, the input stage 10 is for DTL and TTL logic and has an EN918 transistor 11 with a base 12 connected through a 200ohm resistor 13 to the positive voltage supply 14. The input 9 is the emitter lead of transistor 11. The circuit includes a 2N5845 transistor 15 having its base 16 being the collector of transistor 11. The collector 17 of transistor 15 is connected through a 30ohm resistor 18 to the voltage supply 14 and is also connected to the base 19 of 2N5845 transistor 20. The emitter 21 of transistor 15 is connected to ground 22 through an inductor 23 of a tuned pulse expected to be transmitted. The emitter 21 is also connected to the base 24 of 2N5845 transistor 25. The collector 26 of transistor 20 is connected to the voltage supply 14 and to the load 27. The emitter 28 of transistor 20 is connected to the load 27 and to the collector 29 of transistor 25. The emitter 30 of transistor 25 is connected to ground.

When transistor 15 is turned on, inductive load 23 allows almost full power to be applied initially to the base of transistor 25 until the magnetic field of inductor 23 saturates and the base current of transistor 25 is turned off by inductor voltage decay. Resistor 18 has current pulled through it while transistor 15 is on, but when the input 9 is turned off and transistor 15 then turns off, resistor 18 pulls current through transistor 20 to shunt off any voltage which may have been capacitively retained by the load 27.

If the load does not require shunting in the off state, i.e. a non-capacitive load, resistor 18 may be eliminated and transistor 20 may be replaced by a resistor.

Obviously many modifications and variations of the present invention are possible in light of the above teachings. It is therefore to be understood that within the scope of the appended claims the invention may be practiced otherwise than as specifically described.

What is claimed is:

1. A high current pulser circuit comprising:
    means to supply voltage;
    an input stage electrically connected to said voltage supplying means;
    a first transistor with its base electrode electrically connected to said input stage and with its collector electrode connected to said voltage supplying means;
    a second transistor with its base electrode connected to the emitter electrode of said first transistor and with its emitter electrode connected to said voltage supplying means;
    an inductor interconnecting the emitter electrode of said first transistor and the emitter electrode of said second transistor;
    a load interconnecting said voltage supplying means and the collector electrode of said second transistor; and
    means to bleed off voltage connected between said voltage supplying means and the collector electrodes of said first and second transistor.

2. The device of claim 1 wherein said voltage bleeding means comprises:
    a resistor interconnecting said voltage supplying means and the collector electrode of said second transistor; and
    an electrical connection between said voltage supplying means and the collector electrode of said first transistor.

3. The device of claim 1 wherein said voltage bleeding means comprises:

a resistor interconnecting said voltage supplying means and the collector electrode of said first transistor; and a third transistor having its collector electrode connected to said voltage supplying means and having its base electrode connected the collector electrode of said first transistor and having its emitter electrode connected to the collector electrode of said second transistor.

4. The device of claim 1 wherein said input stage comprises:

a fourth transistor having its emitter electrode used as a logic input lead and having its collector electrode connected to the base electrode of said first transistor; and a resistor interconnecting said voltage supplying means and the base electrode of said fourth transistor.

* * * * *